(12) United States Patent
Hashim et al.

(10) Patent No.: US 7,294,242 B1
(45) Date of Patent: *Nov. 13, 2007

(54) COLLIMATED AND LONG THROW MAGNETRON SPUTTERING OF NICKEL/IRON FILMS FOR MAGNETIC RECORDING HEAD APPLICATIONS

(75) Inventors: Imran Hashim, San Jose, CA (US); Seh-Kwang Lee, Kyunggido (KR); Thomas Brezoczky, San Jose, CA (US); Sesh Ramaswami, Saratoga, CA (US)

(73) Assignee: Applied Materials, Inc., SAnta Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/138,429

(22) Filed: Aug. 24, 1998

(51) Int. Cl.
 *C23C 14/00* (2006.01)
 *C23C 14/32* (2006.01)

(52) U.S. Cl. .............................. 204/192.2; 204/298.11; 204/298.16

(58) Field of Classification Search ........... 204/192.12, 204/192.2, 192.15, 298.16, 298.11
See application file for complete search history.

(56) References Cited

U.S. PATENT DOCUMENTS

| | | | | |
|---|---|---|---|---|
| 3,669,860 A | * | 6/1972 | Knowles et al. ....... | 204/192.12 |
| 4,500,409 A | * | 2/1985 | Boys et al. ............ | 204/298.03 |
| 4,776,938 A | * | 10/1988 | Abe et al. .............. | 204/192.15 |
| 4,865,709 A | * | 9/1989 | Nakagawa et al. .... | 204/192.12 |
| 5,328,583 A | | 7/1994 | Kameyama et al. ... | 204/192.12 |
| 5,366,607 A | | 11/1994 | Lal et al. ............... | 204/298.19 |
| 5,380,414 A | * | 1/1995 | Tepman ................... | 204/192.3 |
| 5,455,197 A | | 10/1995 | Ghanbari et al. .......... | 437/192 |
| 5,512,150 A | | 4/1996 | Bourez et al. ........... | 204/192.2 |
| 5,519,373 A | * | 5/1996 | Miyata ....................... | 335/306 |
| 5,527,438 A | * | 6/1996 | Tepman ................. | 204/192.12 |
| 5,583,725 A | | 12/1996 | Coffey et al. ............... | 360/113 |
| 5,589,039 A | | 12/1996 | Hsu ....................... | 204/192.12 |
| 5,593,551 A | * | 1/1997 | Lai ....................... | 204/192.12 |
| 5,616,218 A | * | 4/1997 | Alex ..................... | 204/192.15 |
| 5,643,422 A | * | 7/1997 | Yamada ................. | 204/192.15 |
| 5,660,744 A | | 8/1997 | Sekine et al. .......... | 219/121.43 |
| 5,688,380 A | | 11/1997 | Koike et al. ............. | 204/192.2 |
| 5,718,812 A | | 2/1998 | Takaoka ................. | 204/192.2 |
| 5,728,276 A | * | 3/1998 | Katsuki et al. ........ | 204/298.11 |
| 5,807,467 A | * | 9/1998 | Givens et al. ......... | 204/192.12 |
| 5,945,008 A | * | 8/1999 | Kisakibaru et al. ........... | 216/71 |
| 6,014,943 A | | 1/2000 | Arami et al. ............ | 118/723 E |

* cited by examiner

*Primary Examiner*—Patrick Joseph Ryan
*Assistant Examiner*—Julian Mercado
(74) *Attorney, Agent, or Firm*—Charles S. Guenzer

(57) ABSTRACT

An apparatus and method for sputter depositing a magnetic film on a substrate to produce a magnetic device such as magnetic recording heads for reading digital information from a storage medium. The apparatus of the invention includes a sputtering chamber containing a target and a substrate, and a magnet array disposed within the chamber to form a substantially parallel magnetic field at a surface of the substrate. The sputtering chamber reduces interference between the magnetron and the magnet array by providing a long throw distance and/or a grounded collimator. The magnet array is preferably a circular ring.

39 Claims, 3 Drawing Sheets

COLLIMATED AND LONG THROW MAGNETRON SPUTTERING OF NICKEL/IRON FILMS FOR MAGNETIC RECORDING HEAD APPLICATIONS

FIELD OF THE INVENTION

The present invention relates to an apparatus and method for forming magnetic recording heads. More particularly, the present invention relates to providing a parallel magnetic field at a substrate during sputter deposition of a metal film onto the substrate.

BACKGROUND OF THE INVENTION

Magnetic read-write heads are used in the recording and retrieval of digital information from magnetic discs, magnetic tape, or other information storage devices. The magnetic heads typically include one or more thin layers of magnetic material that is oriented to generate a magnetic field that alters the recording media, or to sense a magnetic field on the recording media without interference. The thin layer of magnetic material is typically deposited on a substrate that is used to prepare the magnetic recording head.

FIG. 1 (prior art) illustrates a typical magnetoresistive head 5 that reads information from magnetic medium 6. The magnetoresistive head 5 includes a soft magnetic layer 7 (e.g., 80% nickel, 20% iron) that functions as the magnetoresistive sense layer, and a hard magnetic layer 8 (e.g., 75% nickel, 20% iron, 5% chromium). The magnetic layers are deposited on a non-magnetic substrate 4 such as aluminum oxide or an alloy of aluminum/titanium/carbon. The soft magnetic layer 7, and the hard magnetic layer 8, are separated by a spacer layer 9 (e.g., tantalum). The magnetic layers are typically manufactured by sputtering a target comprising the metal alloy to deposit particles of the metal alloy onto a substrate positioned within a magnetic field. The magnetic field orients the depositing particles and magnetizes the deposited film. Performance of the magnetic heads is enhanced by depositing the thin film within a substantially parallel magnetic field, as described in U.S. Pat. No. 5,589,039. Sputtering of the target can occur within a magnetic field as known in the art. However, uniform magnetic fields having a high degree of parallelism at a substrate are difficult to maintain within a sputtering chamber because of interference between the magnetic field at the substrate and a plasma generated within a magnetic field at the target.

U.S. Pat. No. 5,660,744 describes a circular magnet array that is located outside an etch chamber and includes a plurality of magnets that form a parallel magnetic field. In the '744 patent, two external circular magnet arrays are used in conjunction with an electric field to enhance an etching process. The circular magnet arrays generate parallel magnetic fields that are out of phase and are not positioned to form a parallel magnetic field at a surface of a substrate.

Elimination of interference between a plasma generated adjacent a metal alloy target and a parallel magnetic field at the surface of a substrate would substantially improve the manufacture of magnetic films such as used in magnetoresistive heads. Therefore, there is a need for a sputtering chamber that provides a parallel magnetic field at the substrate surface without substantial interference from charged particles.

SUMMARY OF THE INVENTION

The present invention provides an apparatus and method for sputter depositing a magnetic film on a substrate to produce a magnetic device such as a magnetic recording head for reading and writing digital information on a storage device. The apparatus of the invention includes a sputtering chamber containing a target and a substrate, and a magnet array disposed within the chamber to form a substantially parallel magnetic field at a surface of the substrate. The target and the magnet array are separated by distance and/or a grounded collimator to reduce interference with the parallel magnetic field. The target can be any material that retains magnetic properties when deposited on a substrate positioned in a magnetic field. However, the target preferably comprises a nickel/iron alloy, such as Permalloy metals, suitable for forming magnetic recording heads.

In one embodiment, a sputtering process deposits a magnetic film in a chamber containing a grounded collimator that reduces interference between a plasma generated in a magnetic field adjacent the target and the parallel magnetic field at the surface of the substrate. Preferably, the parallel magnetic field is generated by a circular magnet array. In another embodiment of the invention, a long throw sputtering process deposits a magnetic film in a chamber having a long throw distance between the target and the magnet array disposed adjacent the substrate. The long throw process may optionally include a grounded collimator and the circular magnet array.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefor not to be considered limiting of its scope, for the invention may admit to other equally effective embodiments.

DETAILED DESCRIPTION OF THE INVENTION

Figure 2:
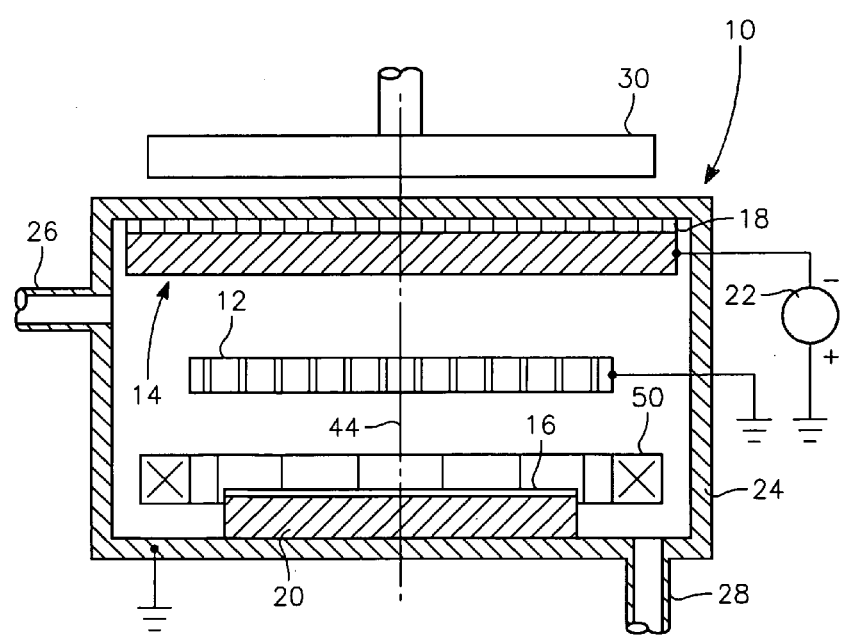
FIG. 2 is a schematic sectional view of a sputtering chamber having a grounded collimator that reduces interference with a parallel magnetic field formed at the surface of a substrate by a circular magnet array.

The apparatus and method of the invention substantially improves deposition of magnetic films on a substrate by reducing interference with a parallel magnetic field provided at the surface of the substrate. The magnetic films are deposited in a sputtering chamber typically comprising a sputtering target and a magnet array that magnetizes a thin film of the target material deposited on a surface of the substrate. FIG. 2 is a schematic sectional view of a preferred sputtering chamber of the present invention having a metal alloy target positioned to deposit a thin film on the surface of a substrate, and further including a grounded collimator that reduces interference with the parallel magnetic field.

The Sputtering Chamber

Referring to FIG. 2, a grounded collimator 12 is disposed between a sputtering target 14 and a semiconductor substrate 16 in a sputter deposition chamber 10. The collimator 12 can comprise a one or more cells as shown in FIG. 2, two or more concentric rings, or other configurations known in the art. The collimator 12 blocks a portion of the target particles traveling obliquely with respect to the substrate surface to provide a more uniform and symmetrical flux of deposition material to each location on the substrate. In addition, the collimator 12 assists in trapping charged particles that interfere with a parallel magnetic field positioned adjacent the substrate 16 as described below.

Referring still to FIG. 2, the sputtering chamber 10 for practicing the invention generally includes a vacuum chamber enclosure wall 24 having at least one gas inlet 26 connected to a gas source (not shown) and an exhaust outlet 28 connected to an exhaust pump (not shown). A substrate support pedestal 20 is disposed at one end of the chamber 10, and the sputtering target 14 is mounted to the other end of the chamber 10. The target 14 is electrically isolated from the enclosure wall 24 by an insulator 18, and the enclosure wall 24 is preferably grounded, so that a negative voltage may be applied and maintained on the target with respect to the grounded enclosure wall 24. In operation, the substrate 16 is positioned on the support pedestal 20 and a plasma is generated in the chamber 10. Charged particles from the target 14 are substantially neutralized by the grounded collimator 12 prior to deposition on the substrate 16.

The Magnet Array

Figure 3:
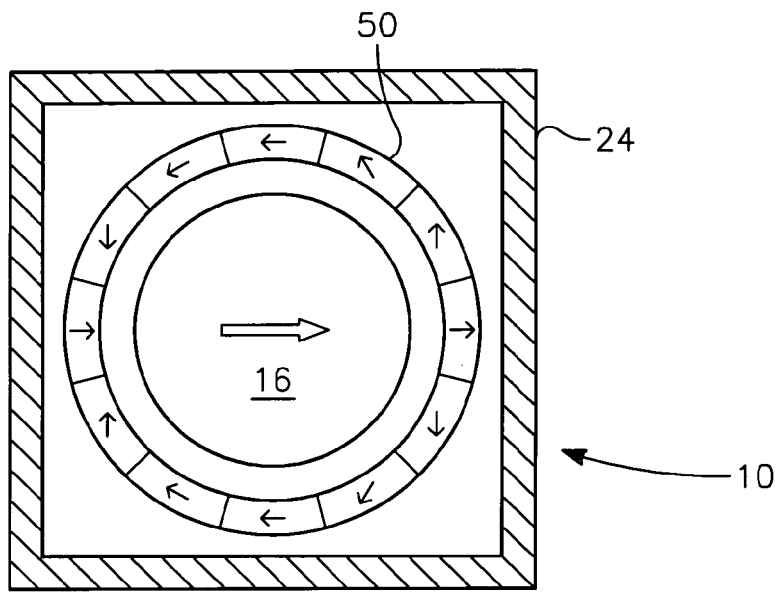
FIG. 3 is a schematic view of the circular magnet array that surrounds a substrate surface in the deposition chamber of FIG. 2.

FIG. 3 is a schematic view of a permanent magnet array 50 having a circular shape that preferably surrounds a substrate surface in the deposition chamber of FIG. 2. The permanent magnet array 50 is located within the chamber 10 and provides a parallel magnetic field at a surface of the substrate 16. The permanent magnet array 50 is known as a Halbach array, and can be an electromagnet or a permanent magnet.

The permanent magnet array 50 comprises segments having different magnetic orientations that combine to form a parallel magnetic field as described in U.S. Pat. No. 5,660,744. The circular magnet array is well known for producing parallel magnetic fields in electric motors. The circular magnet array 50 preferably has 12 or more segments to provide a uniform magnetic field. Placement of the circular magnet array 50 within the chamber walls 24 provides a limited magnetic field that is not substantially impaired by the magnetron 30. Referring to FIG. 2, placement of the grounded collimator 12 between the magnetron 30 and the magnet array 50 in the long throw chamber 10 as shown eliminates interference by the magnetron 30 with the parallel field at the substrate.

In the alternative, the magnet array could have a non-circular configuration as shown in U.S. Pat. No. 5,589,039, particularly when used in combination with the grounded collimator 12 or within a long throw sputtering chamber 10 as described below for an alternate embodiment.

The Deposition Process

During the deposition process of the present invention, using an apparatus such as described in FIG. 2, a process gas comprising a non-reactive species such as Ar, is charged into the vacuum chamber 10 through the gas inlet 26 at a selected flow rate regulated by a mass flow controller (not shown). The chamber pressure is controlled by varying the rate that process gases are pumped through the exhaust outlet 28.

A power source, such as a D.C. power supply 22, applies a negative voltage to the target 14 with respect to the enclosure wall 24 so as to excite the gas into a plasma state.

Ions from the plasma bombard the target 14 and sputter atoms and larger particles of target material from the target 14. The particles sputtered from the target 14 travel along linear trajectories from the target 14, and a portion of the particles collide with, and deposit on, the substrate 16.

A conventional magnetron sputtering source employs a rotating magnet 30 above the target 14 to increase the concentration of plasma ions adjacent to the sputtering surface of the target 14. Rotation of the magnetron 30 during sputtering of the target 14 results in an even erosion profile.

The surfaces of the collimator 12 that are perpendicular to the surface of the substrate 16 block particles travelling obliquely to the surface of the substrate 16 as described in U.S. Pat. No. 5,527,438. Thus, the collimator 12 promotes deposition of target particles traveling normal to the surface of the substrate 16, and such deposition results in columns of deposited material that are easily oriented within the parallel magnetic field maintained at the surface of the substrate. Grounding of the collimator 12 acts as a sink for electrons from the plasma, thus reducing electron bombardment of the substrate, and essentially eliminates interference between the plasma generated by the magnetron 30 and the magnetic field generated by the permanent magnet array 50.

Figure 1:
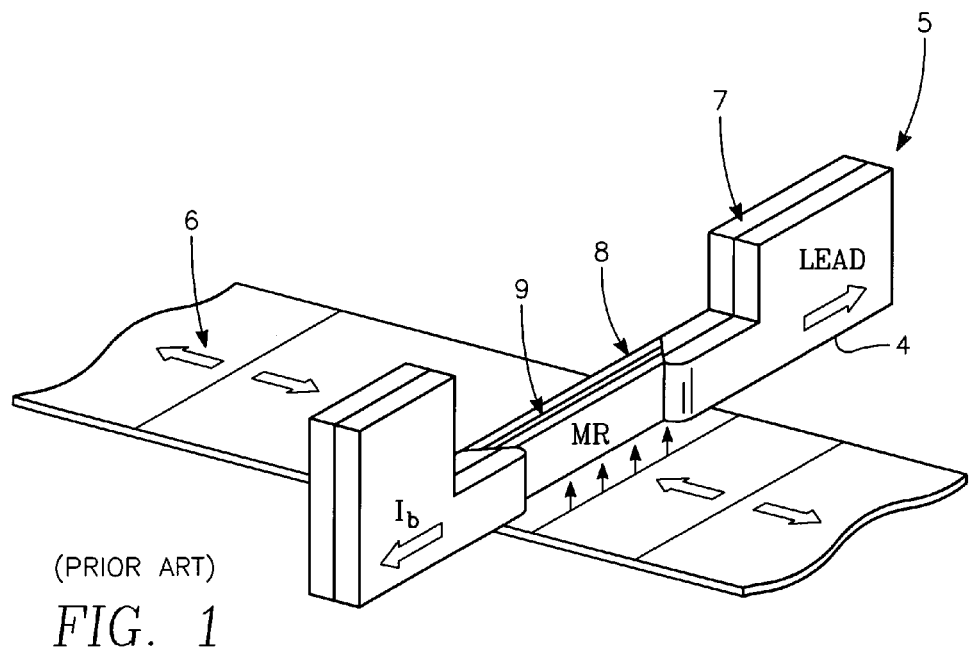
FIG. 1 (prior art) is a schematic view of a typical magnetic recording head utilizing a magnetoresistive sense layer produced by sputtering metal alloys onto a non-magnetic substrate.

The target 14 comprises a material that retains magnetic properties when deposited in a substantially parallel magnetic field. For deposition of magnetic recording heads, the target preferably consists of an alloy of nickel/iron (NiFe) having from 75 to 85 wt % of Ni. Most preferably the target is formed from Permalloy metal which is an optimum NiFe alloy having 80 wt % Ni. Combinations of magnetic layers can be used as discussed for FIG. 1.

Preferably, the exposed surfaces of collimator 12 are composed of a material that is non-contaminating to the chamber when exposed to a plasma. Therefore, the collimator 12 is preferably manufactured from the same material as the target 14. The collimator 12 is supported in the chamber 10 between the substrate 16 and target 14 by conventional means and can be in electrical contact with the chamber walls 24 when both are grounded. The collimator 12 can also be rotated within the chamber 24 if desired to reduce build-up of target material on surfaces that face the target 14.

The collimator 12 provides collimation on a gross scale, i.e., it screens from the stream of target particles passing from the target 14 to the substrate 16 a portion of the target particles which are traveling at highly oblique trajectories with respect to the surface of the substrate 16 (i.e., trajectories at low angles relative to the plane of the substrate surface).

An iterative determination of the size and location of the collimator 12, the optimum substrate and target size and spacing, and the optimal magnetron configuration may be performed through trial and error. However, one skilled in the art could also perform the iterations on the properly programmed computer.

Long Throw Sputtering Chamber

Figure 4:
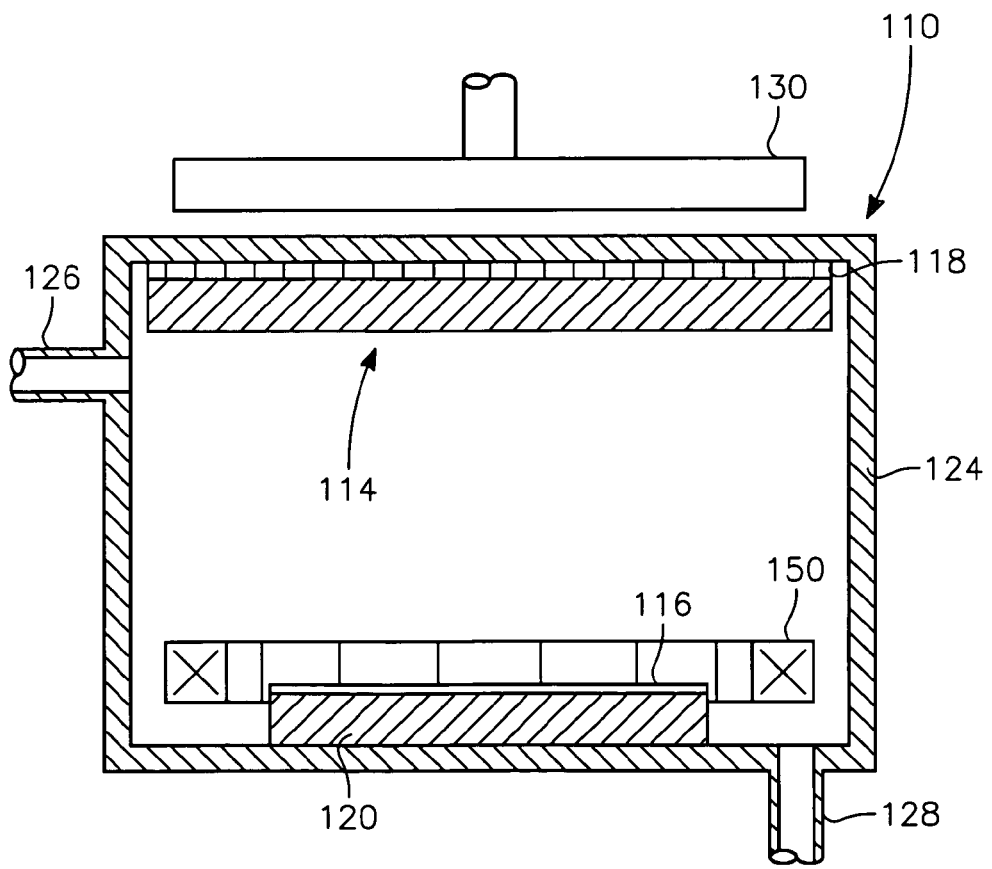
FIG. 4 is a schematic sectional view of a long throw sputter deposition chamber that substantially reduces interference with a parallel magnetic field formed by a circular magnet array without a collimator.

FIG. 4 is a schematic sectional view of a long throw sputtering chamber that substantially reduces interference with the parallel magnetic field at the surface of the substrate without a collimator. Referring to FIG. 4, the long throw sputtering chamber 110 for practicing an embodiment of the invention generally includes the vacuum chamber enclosure wall 124 having the gas inlet 126 and the exhaust outlet 128 connected to an exhaust pump (not shown). The substrate support pedestal 120 is disposed at one end of the chamber 110, and the sputtering target 114 is mounted to the other end of the chamber 110. The target 114 is electrically isolated from the enclosure wall 124 by an insulator 118, and the enclosure wall 124 is preferably grounded, so that a negative voltage may be maintained on the target with respect to the grounded enclosure wall 124. In operation, the substrate 116 is positioned on the support pedestal 120 at a long throw distance from the target 114 of at least 50 mm, preferably at about 80 to 175 mm.

A conventional magnetron sputtering chamber employs the rotating magnet 130 above the target 114 to increase the concentration of plasma ions adjacent to the sputtering surface of the target 114. The magnetron 130 produces a magnetic field that is separated by distance from a parallel magnetic field maintained at the surface of the substrate by the circular magnet array 150 as described above with reference to FIG. 3. The long throw distance facilitates reducing interference with the parallel magnetic field. A grounded collimator (not shown) could be included to further reduce interference as described above. Rotation of the magnetron 130 during sputtering of the target 114 results in an even erosion profile.

Method of Depositing Magnetic Films

The apparatus of the invention deposits a magnetic film on the substrate 16, 116 by sputtering the target 14, 114 with a plasma generated adjacent the target, and by maintaining a surface of the substrate 16, 116 substantially outside the plasma. The substrate 16, 116 is maintained in a magnetic field that is substantially parallel at the substrate surface. The target 14, 114 and the parallel magnetic field is separated by distance and/or a grounded collimator to reduce interference with the substantially parallel magnetic field at the surface of the substrate.

Figure 5:
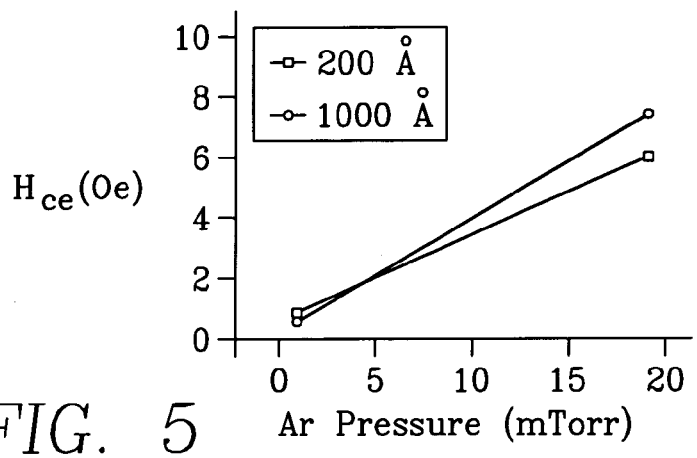
FIG. 5 illustrates the effect of chamber pressure on the easy axis coercivity of a magnetic film deposited in a parallel magnetic field.
Figure 6:
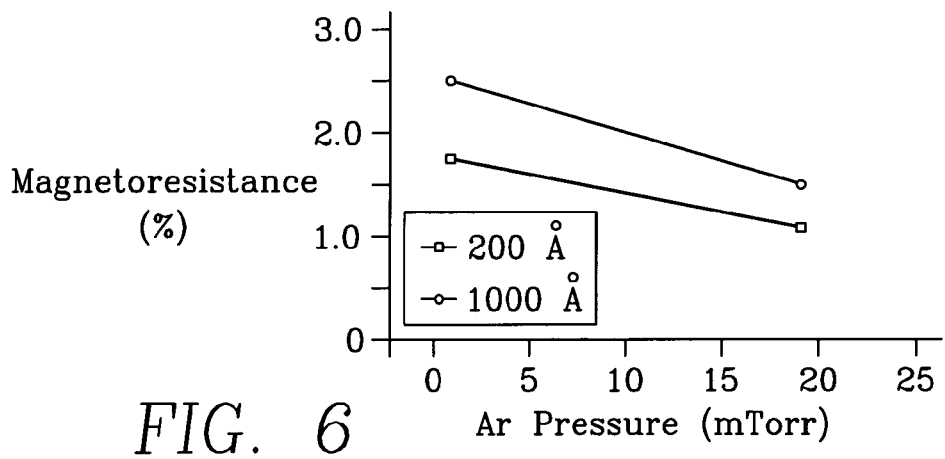
FIG. 6 illustrates the effect of chamber pressure on the magnetoresistance of a magnetic film deposited in a parallel magnetic field.

During deposition of a magnetic film, the chamber pressure is maintained below 15 mTorr, preferably below 5 mTorr, to reduce collision of molecules within the chamber 10 and prevent dispersion of the deposited film. The reduced pressure also results in deposited films having a lower content of the processing gas such as argon. Lower argon content significantly improves the deposited film by reducing the easy axis coercivity of the magnetic film. FIG. 5 illustrates the effect of chamber pressures ranging from 1 to 20 mTorr on the easy axis coercivity of NiFe magnetic films (80% Ni, 20% Fe) having a thickness ranging from 200 to 1000 Å. Lower argon content also significantly improves the deposited film by increasing the magnetoresistance of the magnetic film. FIG. 6 illustrates the effect of chamber pressures ranging from 1 mTorr to 20 mTorr on the magnetoresistance of the NiFe magnetic films of FIG. 5.

Nickel/iron alloys, such as Permalloy metal films, are typically deposited on substrates at a thickness less than about 200 Å for magnetoresistive head applications. The magnetic films are deposited on a non-magnetic substrate such as described for FIG. 1. The strength of the second magnetic field for a 4 inch substrate is preferably from 50 to 100 gauss, and such a parallel magnetic field is readily provided by a permanent magnet array having an outside diameter less than 12 inches. The combination of reduced interference and the permanent magnet array as described herein results in a parallel magnetic field at the surface of the substrate that is easily aligned with the substrate with less than 1% dispersion.

EXAMPLE

The present invention was reduced to practice by placing a permanent magnet array within an ENDURA™ PVD chamber in combination with a Permalloy metal target and a substrate comprising aluminum, titanium, and carbon. The substrate had a diameter of 4 inches and the Permalloy metal target had a diameter of 12 inches. The distance between the target and the substrate was 120 mm during processing. The permanent magnet array was a commercially available Halbach array that had an inside diameter of 9 inches and an outside diameter of 11 inches.

The PVD chamber included a magnetron that generates a magnetic field of 30 gauss adjacent the target. D.C. power of 100 W was applied to the target during deposition.

Figure 7:
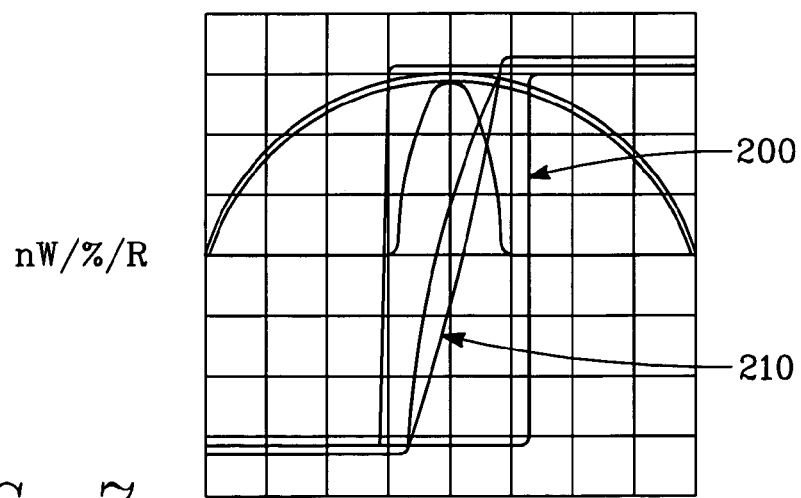
FIG. 7 is a B-H curve for an oriented Nickel/Iron Film deposited in accordance with the present invention.

The deposited film had excellent magnetic properties as shown in FIG. 7 indicating that the Halbach array maintain a parallel magnetic field at the surface of the substrate and deposited a highly oriented film. The easy axis hysteresis loop 200 and the hard axis hysteresis loop 210 are well defined in FIG. 7, and establish that the deposited film is magnetically oriented.

While the foregoing is directed to embodiments of the present invention, other and further embodiments of the invention may be devised without departing from the basic scope thereof. The scope of the invention is determined by the claims that follow.

What is claimed is:

1. An apparatus for depositing a magnetic film, comprising:
    a sputtering chamber containing a target comprising a magnetic sputtering material and a substrate support having a substrate surface that is separated from the target; and
    an annular magnet array disposed within the sputtering chamber, the annular magnet array being configured to form at the substrate surface of the substrate support a magnetic field that is substantially parallel to and extends along the substrate surface of the substrate support and is flatter and more parallel to the substrate surface at a first position adjacent to the substrate surface than at a second position similarly adjacent to the target, the annular magnet array being concentrically positioned around an outer perimeter of the substrate surface of the substrate support.

2. The apparatus of claim 1, wherein the target comprises a material that retains magnetic properties when deposited on the surface of a substrate.

3. The apparatus of claim 1, wherein the target is separated from the substrate support by a distance of at least 50 mm.

4. The apparatus of claim 3, wherein the target comprises a nickel/iron alloy.

5. The apparatus of claim 1, wherein the annular magnet array comprises a plurality of magnetic segments positioned in an annular configuration around the perimeter of the substrate support, the plurality of magnetic segments having different magnetic orientations that cooperatively to form the magnetic field that is parallel to the substrate surface.

6. The apparatus of claim 1 wherein the target and the substrate supporting surface are separated by a distance of at least 50 mm.

7. The apparatus of claim 1, wherein said magnetic field at said substrate surface is substantially parallel to said substrate surface.

8. The apparatus of claim 1, wherein said annular magnet array comprises a plurality of permanent magnets.

9. The apparatus of claim 8, wherein said plurality of permanent magnets are magnetized parallel to a plane of said substrate surface.

10. The apparatus of claim 1, wherein said annular magnet array is a Halbach array.

11. The apparatus of claim 1, wherein said annular magnet array is stationary and produces a static magnetic field.

12. The apparatus of claim 1, further comprising a magnetron disposed on a side of said target opposite said substrate surface of said substrate support.

13. The apparatus of claim 1, wherein said sputtering chamber further comprises a grounded collimator positioned between the target and the substrate support.

14. The apparatus of claim 1, wherein the substrate surface is circular for supporting a single circular substrate.

15. A method for depositing a magnetic film within a sputtering chamber containing a target and a substrate, comprising:
sputtering the target onto a surface of the substrate at a pressure less than about 15 mTorr; and
generating at the surface of the substrate a static magnetic field that is substantially parallel to and extends along the surface of the substrate during sputtering using a stationary annular magnet array concentrically disposed around a perimeter of the surface of the substrate within the sputtering chamber, wherein the magnetic field is more parallel to the substrate surface at a position closer to the substrate than to the target.

16. The method of claim 15, wherein the sputtering occurs at a chamber pressure less than about 5 mTorr.

17. The method of claim 15, wherein the target and the surface of the substrate are maintained at a distance of at least 50 mm during sputtering.

18. The method of claim 17, wherein the target comprises a Ni/Fe alloy.

19. The method of claim 15 wherein said target comprises a material that is magnetic when sputter deposited in a substantially parallel magnetic field.

20. The method of claim 15, wherein said annular magnet array comprises an array of permanent magnets magnetized parallel to a plane of the surface of the substrate during sputtering.

21. The method of claim 15, wherein said annular magnet array comprises a Halbach array.

22. The method of claim 15, wherein said magnetic field at the surface of the substrate is substantially parallel to the surface of said substrate.

23. The method of claim 15, wherein the substrate is processed to form a magnetic recording head.

24. The method of claim 15, further comprising generating a target magnetic field adjacent said target from a magnetron positioned in back of said target with respect to said substrate.

25. The method of claim 15, further comprising collimating sputtering of the target with a grounded collimator disposed between the target and the substrate.

26. The method of claim 15, wherein the surface of the substrate is circular and the annular magnet array is disposed around only a single substrate.

27. A method for depositing a magnetic film within a sputtering chamber containing a target and a substrate, comprising:
sputtering the target onto a surface of the substrate at a pressure less than about 15 mTorr;
collimating sputtering of the target with a grounded collimator disposed between the target and the substrate;
generating at the surface of the substrate a static magnetic field that is substantially parallel to the surface of the substrate during sputtering using a stationary annular magnet array disposed around a perimeter of the surface of the substrate within the sputtering chamber, wherein the magnetic field is flatter at a first position adjacent to the substrate surface than at a second position similarly adjacent to the target;
generating a target magnetic field from a magnetron positioned in back of said target with respect to substrate; and
wherein the grounded collimator removes charges from target particles and reduces interference between the target magnetic field and the static magnetic field which is substantially parallel to the surface of the substrate.

28. The method of claim 27, wherein the annular magnet array is disposed around a perimeter of only one substrate.

29. An apparatus for depositing a magnetic film, comprising:
a sputtering chamber configured to receive a sputtering target for sputter depositing a magnetically alignable material onto a substrate supported on a support surface in opposition to said target along an axial direction; and
a stationary annular array of permanent magnets surrounding an outer periphery of said support surface and continuously extending from one side to the other side of said support surface parallel to said central axis and creating at a region closer to the support surface than to the target a magnetic field extending horizontally along and parallel to said support surface.

30. The apparatus of claim 29, wherein said array is a Halbach array.

31. The apparatus of claim 29, further comprising a grounded collimator positioned between said target and said support surface.

32. The apparatus of claim 29, wherein said material comprises nickel and iron.

33. The apparatus of claim 29, further comprising a magnetron disposed on a side of said target opposite said support surface.

34. The apparatus of claim 29, wherein the substrate is circular and the support surface is circular and configured for supporting single substrate.

35. A method for depositing a magnetic film within a sputtering chamber containing a target and a substrate support for supporting a circular substrate to be deposited with said magnetic film, comprising:
sputtering the target onto a surface of the substrate; and
generating at a surface of the substrate a static magnetic field that is substantially parallel to and extends along the surface of the substrate during sputtering using a stationary annular magnet array concentrically disposed around a perimeter of the surface of the substrate within the sputtering chamber, wherein the magnetic field is flatter adjacent to the surface of the substrate than adjacent to the target.

36. The method of claim 35, further comprising collimating sputtering of the target with a grounded collimator disposed between the target and the substrate.

37. The method of claim 35, further comprising generating a target magnetic field from a magnetron positioned in back of said target with respect to said substrate support.

38. The apparatus of claim 35, wherein said substantially parallel static magnetic field extends along said surface of said substrate.

39. The method of claim 35, wherein the substrate support is circular and configured for supporting a single substrate.

* * * * *